United States Patent
Stickel et al.

[19]

[11] Patent Number: 6,005,250
[45] Date of Patent: Dec. 21, 1999

[54] ILLUMINATION DEFLECTION SYSTEM FOR E-BEAM PROJECTION

[75] Inventors: Werner Stickel, Ridgefield, Conn.; Steven Douglas Golladay, Hopewell Junction, N.Y.

[73] Assignee: Nikon Corporation, Tokyo, Jordan

[21] Appl. No.: 09/138,595

[22] Filed: Aug. 22, 1998

[51] Int. Cl.[6] .................................................. H01J 37/09
[52] U.S. Cl. .............................. 250/396 R; 250/396 ML; 250/398
[58] Field of Search ..................... 250/396 ML, 396 R, 250/398, 492.22, 492.23

[56] References Cited

U.S. PATENT DOCUMENTS

| | | | |
|---|---|---|---|
| 5,635,719 | 6/1997 | Petric | 250/396 ML |
| 5,821,542 | 10/1998 | Golladay | 250/396 R |

*Primary Examiner*—Kiet T. Nguyen
*Attorney, Agent, or Firm*—Graham S. Jones, II

[57] ABSTRACT

An electron beam projection system comprises a source of an electron beam, a first doublet of condenser lenses with a first symmetry plane, a first aperture comprising a trim aperture located at the first symmetry plane of the first doublet also serving as a first blanking aperture. A second aperture comprises a shaping aperture located below the trim aperture. A second doublet of condenser lenses with a second symmetry plane is located below the second aperture, the second doublet having a symmetry plane. A third aperture is located at the symmetry plane of the second doublet wherein the third aperture comprises another blanking aperture. There are first blanking plates between the first condenser lens and the trim aperture, and second electrostatic alignment plates between the trim aperture and the second aperture. The second doublet comprises a pair of illuminator lenses including deflectors coaxial therewith and located inside the radius of the lenses and shielding rings located along the inner surfaces of the lenses, and correctors located coaxial with the deflectors and inside or outside of the radii thereof including stigmators, focus coils and a hexapole.

17 Claims, 3 Drawing Sheets

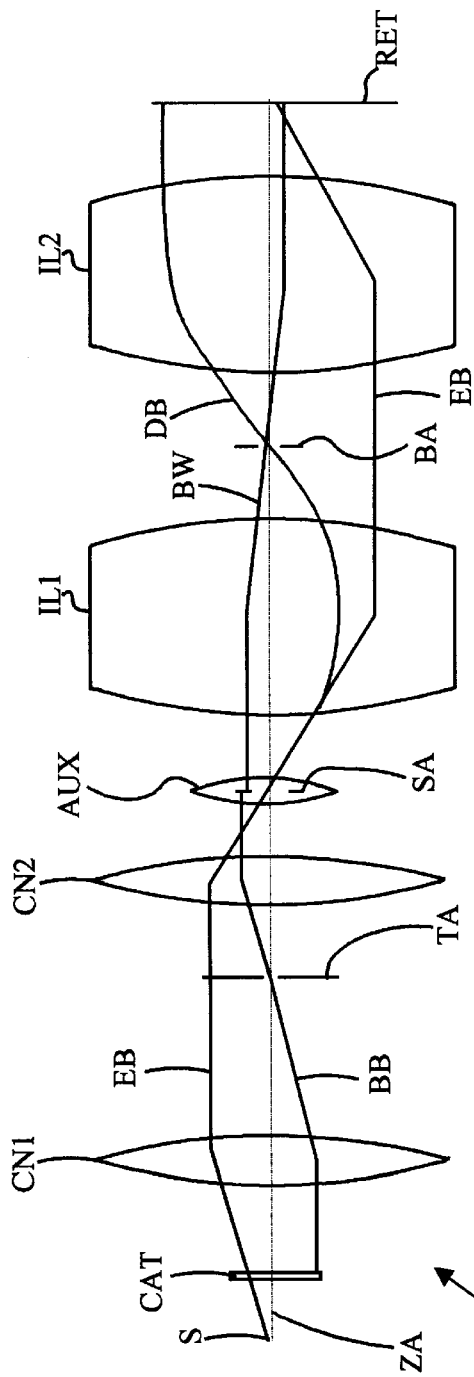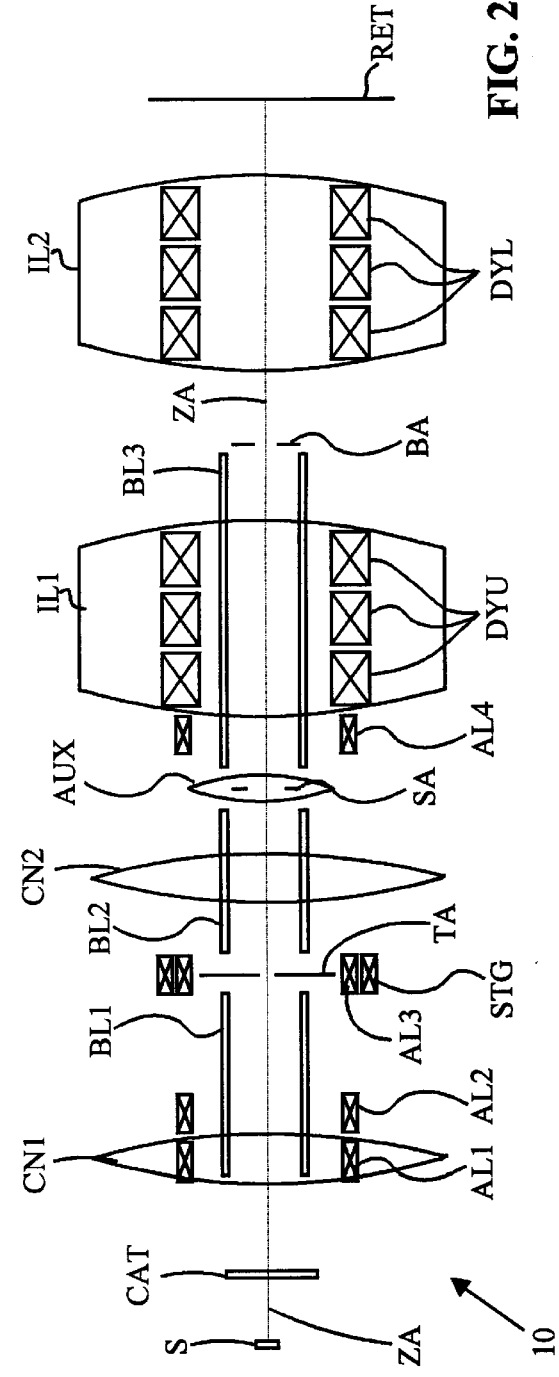

ILLUMINATION DEFLECTION SYSTEM FOR E-BEAM PROJECTION

BACKGROUND OF THE INVENTION

1. Field of the Invention

This invention relates to electron beam deflection and more particularly to illumination deflection in electron beam projection systems.

2. Description of Background

Problem

An Electron Beam Projection System (EBPS) of which this invention is a part relies on large distance beam scanning (over 20 to 30 mm) of a reticle containing a pattern to be exposed on a wafer. A reticle containing the pattern is scanned with a square shaped beam in telecentric projection, i.e. with perpendicular incidence at all off-axis positions. One method considered for the illumination-deflection system is based on the reversed beam trace in the collimator, the first lens in the doublet, which produces a demagnified image of the illuminated section of the reticle (the subfield) on the wafer. Accordingly the illuminator section is mirror-symmetric to the collimator as indicated in U.S. Pat. No. 5,635,719 of Petric for "Variable Curvilinear Axis Deflection Means for Particle Optical Lenses" following the reticle plane, but requires additional predeflectors and is therefore overly long and complicated for the purpose of illuminating a reticle subfield with less stringent performance requirements than placed on the collimator. There is a strong incentive to reduce complexity and length of the overall illumination section of the system, of which the illuminator-deflector is a subsection, without sacrificing electron-optical performance and increasing demands on the deflector control electronics.

SUMMARY OF THE INVENTION

A charged particle beam projection system or electron beam projection system comprises a source of an electron beam, a first doublet of condenser lenses with a first symmetry plane, a first aperture comprising a trim aperture located at the first symmetry plane of the first doublet also serving as a first blanking aperture. A second aperture comprises a shaping aperture located below the trim aperture. A second doublet of condenser lenses with a second symmetry plane is located below the second aperture, the second doublet having a symmetry plane. A third aperture is located at the symmetry plane of the second doublet wherein the third aperture comprises another blanking aperture.

Definition of "Doublet"

The term "doublet" as used herein denotes a pair of lenses operated under a specific symmetry condition, established in the following way:

A source (of particles) illuminates an object in front of a lens pair. The object is located precisely in the back focal plant of the first lens. The first lens generates an image of the source between the pair, and an image of the (closer) object at infinity. This effectively collimates the rays of particles emerging from the object. Accordingly the first lens is labeled "collimator". The second lens is positioned exactly such that its back focal plane coincides with the front focal plane of the first lens. The second lens focuses the collimated, therefore parallel rays at its front focal plane, which then becomes the image plane for the object. Since the object is now projected into the image plane, the second lens is referred to as "projector". Under this condition the optical magnification of the lens pair is given by the ratio of the focal lengths of projector to collimator, $M=f2/f1$. Simultaneously, the object—image distance, is given by $L=2(f1+f2)$. If lenses of the same shape are used, than their sizes scale with their respective focal lengths. For example, if $f1=4f2$, the collimator must be four times as large as the projector to maintain congruency of the lenses, Consequently, the plane of coincidence of focal planes between the lenses, located at a distance from the object of $z1=2f1$, and by $z2=2f2$ from the image, constitutes a plane of symmetry. The doublet is "symmetric" about the coincidence plane. In the special case of $f1=f2$ or unity magnification, the doublet is "mirror-symmetric".

If the source is placed infinitively far upstream of the doublet, its image will appear at the coincidence or symmetry plane. As a consequence, all rays originating from any one point on the source or its intermediate image at the symmetry plane will be parallelized by the projector. The doublet then is characterized as a "telecentric symmetric doublet". If the lenses are of the magnetic type, their field polarities are generally chosen to be opposite to each other as to completely cancel the image rotation caused by each individual lens. One then speaks of an "antisymmetric doublet".

The reason for operating the lenses in the described way as a doublet is that several aberrations are eliminated (as one lens compensates the aberrations of the other lens in exactly the right ratio) and consequently image blur is reduced.

BRIEF DESCRIPTION OF THE DRAWINGS

The foregoing and other aspects and advantages of this invention are explained and described below with reference to the accompanying drawings, in which:

FIG. 1 shows a schematic diagram of an overall Electron Beam Projection System (EBPS) in accordance with this invention.

FIG. 2 shows the device of FIG. 1 with the more details of the hardware illustrated to provide additional explanation as to how the EBPS device operates.

BACKGROUND OF EMBODIMENT

Figure 3:
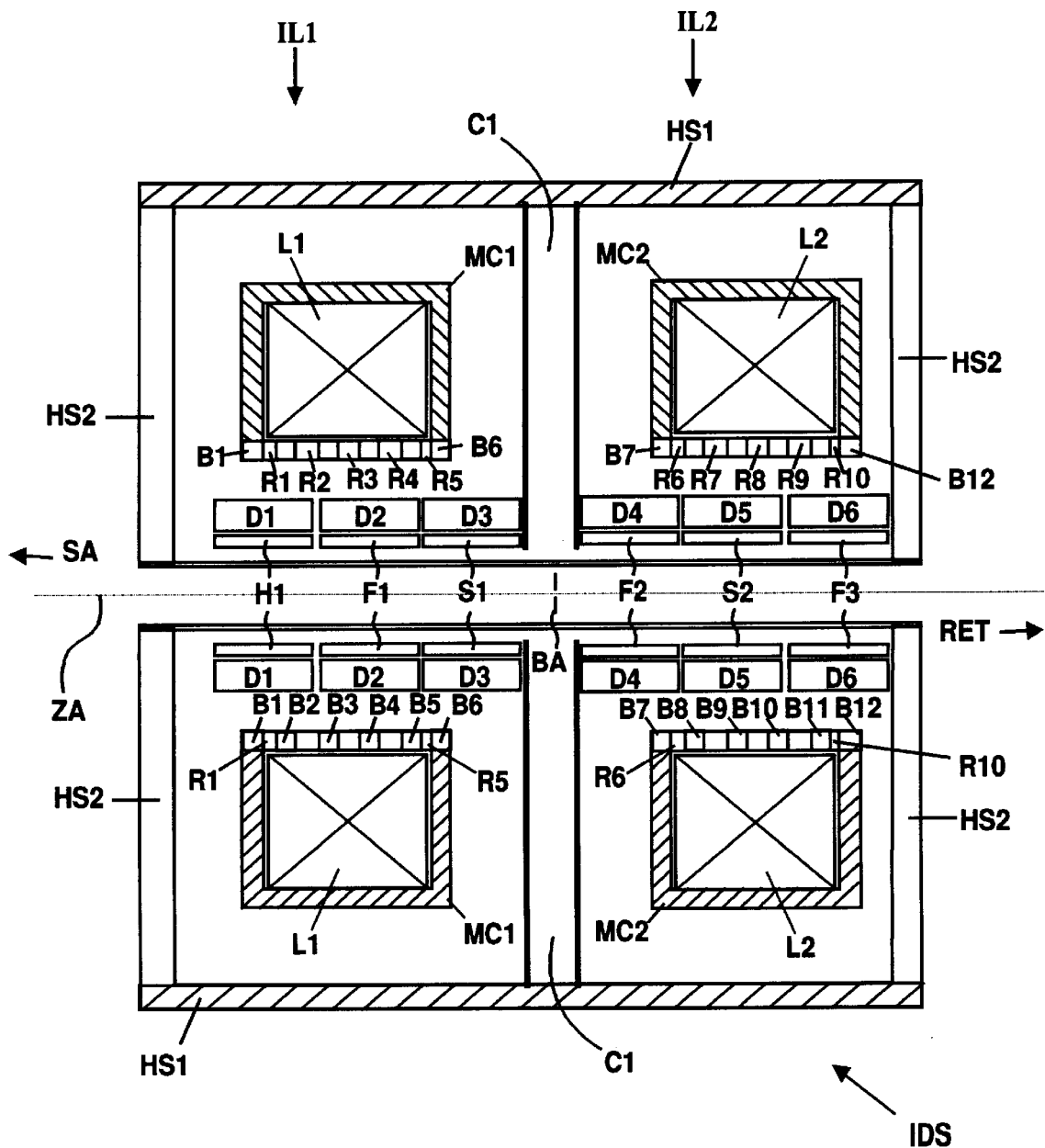
FIG. 3 shows an illumination deflection system for E-beam projection in the system of FIGS. 1 and 2 in accordance with this invention.

Blanking System for Electron Beam Projection System
The illuminator-deflector is part of the illumination section of the EBPS, which in addition consists of the electron gun generating the beam, and a condenser sub-section. The purpose of the condenser sub-section is to generate a beam crossover serving as the "source" for the subsequent optics, and simultaneously image the emitter surface into a square aperture opening, which in turn serves as the object for the illuminator-deflector and is imaged onto and scanned across the reticle. The condenser sub-section is preferably configured and operated as a doublet, as is the illuminator-deflector, to provide optimum optical performance and shortest length. Another key function of the entire illumination section is to provide the capability of dynamic illumination control, which means the timing of exposure of the reticle and consequently the wafer. This function is generally known as "blanking", described hereafter in its details, which are particularly suited for integration with the illuminator-deflector.

In E-beam probe-forming as well as projection systems the usual method of intensity control (on the target) is to blank the beam for certain periods of time, i.e. preventing the beam from reaching the target by moving it off an aperture (an opening in a diaphragm), so that it is blocked by the diaphragm. This blocking or blanking aperture is strategically located at an image of the electron source, where the beam diameter and intensity profile is clearly defined and concentrated. Without further precaution, however, the beam would also move at the target during the finite time of blanking, leading to a "smearing" of the image the target.

To prevent this problem of smearing, the proper solution is to position the blanking deflector exactly at a point along the beam axis, which is optically conjugate to the target or, in other words, at the object or an intermediate image of the object, the final image of which is the beam spot at the target. In this case the beam would pivot about the point, where the object or its intermediate image is located, and this pivot point would be stationary during blanking.

In many cases, however, this ideal situation is not attainable usually due to spatial constraints. Furthermore, the source image, which is to be moved laterally off the system axis, is in general not represented by a sharply defined or laterally limited beam cross-section, but rather by a distribution usually approximated by a Gaussian or bell-shaped profile, the tails of which laterally extend (in principle) into infinity. Consequently, to blank the beam completely, one would (in principle) require an infinite degree of lateral beam deflection, which, of course, is impossible.

Beam blanking using double deflectors comprising a dual set of deflectors, arranged in tandem, for the purpose of properly positioning the virtual pivot point, as well as supporting fast electric blanking with slow magnetic blanking is practiced in systems like IBM's EL-4, but such a single tandem deflector arrangement would be ineffective for EBPS, such as is described in U.S. Pat. No. 5,635,719 of Petric for "Variable Curvilinear Axis Deflection Means for Particle Optical Lenses".

Due to the shortness of the column required to provide illumination of the reticle at various large off-axis positions, and due to the lack of significant deflection angle magnification at the blanking aperture (as is provided by lenses in probe-forming systems) the sensitivity of the blanker would be insufficient. The extreme beam power requires improved thermal management, i.e. dissipation of the power at uncritical locations such as the trim aperture. The lateral position control at the object aperture during blanking is critical more for the purpose of preventing uneven local heating than conjugate beam motion at the target. The delicacy of beam lateral position control in the plane of the second blanking aperture requires a well-defined beam profile to allow for residual beam motion without undesirable intensity modulation at the target.

FIG. 1 shows a schematic diagram of the optics of the illumination section of an Electron Beam Projection System (EBPS) 10 such as described by H. C. Pfeiffer and W. Stickel in Microelectronics Engineering 27 (995) 143. The purpose of this section is to provide appropriately distributed and positioned (electron) radiation energy to the object of the subsequent projection section, which generates a (reduced) image of this object at its target plane. The object contains an (enlarged) replica of the integrated circuit pattern, a reticle RET, to be reproduced in the radiation-sensitive material covering the substrate, e.g. a semiconductor wafer, in the target plane.

The lines ZA, EB and BB/BW symbolically represent, respectively, the central or symmetry axis ZA of the section, the central imaging ray EB of the (virtual) source S, and the central imaging ray BB/BW of the so-called "cross-over", where all rays originating from the extended surface of the electron emitter or cathode CAT merge for the first time. The lenses CN1 and CN2 as well as the lenses IL1 and IL2 are arranged and operated in an optical configuration called an "anti-symmetric doublet", each having a symmetry plane, at which the trim aperture TA and blanking aperture BA, respectively, are placed. The auxiliary lens AUX provides an additional degree of freedom to assure proper placement of the cross-over image at blanking aperture BA.

Trim aperture TA serves to trim or truncate the outer fringes of the intensity distribution in the cross-over, which is in general non-uniform (approximately Gaussian), such that the combined image of trim aperture TA and its truncated intensity distribution matches or is slightly smaller than the size of the opening in the diaphragm denoted as blanking aperture BA.

The ray BW is in actuality the continuation of central imaging ray BB. This discontinuity, shown at the shaping aperture SA, indicates that the beam is "shaped" into the proper form required at the reticle RET, e.g. a square. For that purpose the beam slightly "overfills" the shaping aperture SA to ensure a uniform intensity profile across the opening in the diaphragm of the shaping aperture SA and ultimately across its image at the reticle RET, which illuminates an equally shaped "subfield" in the reticle RET. Finally, the ray DB represents the shaping aperture imaging ray EB, when it is deflected to illuminate an off-axis subfield in the reticle RET. The condition for ray (beam) DB is to cross the system axis ZA and pass through blanking aperture BA under any deflected condition.

FIG. 2 shows additional details required to provide correct illumination of reticle subfields and consequently proper operation of the entire EBPS 10. There are magnetic deflectors ALi required to maintain beam alignment with respect to the apertures blanking aperture BA, shaping aperture SA and trim aperture TA. A set of magnetic quadrupoles called a stigmator STG is used to ensure symmetric (square) beam shape at shaping aperture SA. There are sets of electric deflection plates BLi (where "i" is an integer greater than 1, e.g. BL1, BL2, and BL3) for providing electric deflection of the beam. These are the devices, the arrangement and operation of which are at the core of the present invention. Electric deflection, though less efficient than magnetic deflection, is used for the high speed or high frequency response required for precise exposure dose control at the target of the EBPS 10. This is accomplished by deflecting the beam off the aperture openings, such that all radiation is blocked by the diaphragms for predetermined time periods. Finally, magnetic deflectors DYU and DYL operate to position the beam over the (off-axis) subfield in the reticle RET selected at the time. Their relative strengths and deflection directions are adjusted to guarantee a pivot point of the beam fixed at the center of the opening in the diaphragm of blanking aperture BA, as well as perpendicular landing at the reticle RET. The combination of illuminator lens doublet IL1 & IL2, deflectors DYU & DYL, and additional corrector elements not shown here constitute an optic system referred to as Curvilinear Variable Axis Lens or CVAL. CVAL provides best optic performance or minimum image blurring and distortion at largest off-axis positions and shortest distance between object and image, namely shaping aperture and reticle RET.

The lines ZA, EB and BB/BW symbolically represent, respectively, the central or symmetry axis of the section, the central imaging ray of the (virtual) source S, and the central imaging ray of the so-called "cross-over", where all rays originating from the extended surface of the electron emitter or cathode CAT merge for the first time. The lenses CN1 and CN2 as well as the lenses IL1 and IL2 are arranged and operated in an optical configuration called an "anti-symmetric doublet", each having a symmetry plane, at which the trim aperture TA and blanking aperture BA, respectively, are placed. The auxiliary lens AUX provides an additional degree of freedom to assure proper placement of the cross-over image at blanking aperture BA.

Trim aperture TA serves to trim or truncate the outer fringes of the intensity distribution in the cross-over, which is in general nonuniform (approximately Gaussian), such that the combined image of trim aperture TA and its truncated intensity distribution matches or is slightly smaller than the size of the opening in the diaphragm of the blanking aperture BA.

The ray BW is in actuality the continuation of ray BB. The discontinuity between ray BB and ray BW shown at the shaping aperture SA indicates that the beam which includes ray BB is "shaped" into the proper form required at the reticle RET, e.g. a square. For that purpose the beam which includes ray BB slightly "overfills" the shaping aperture SA to ensure a uniform intensity profile across the opening in the diaphragm of the shaping aperture SA and ultimately across its image at the reticle RET, which illuminates an equally shaped "subfield" in the reticle RET. Finally, the ray DB represents the effect of the shaping aperture on the beam represented by imaging ray EB, when it is deflected to illuminate an off-axis subfield in the reticle RET. The condition for ray (beam) DB is to cross the system axis ZA and pass through blanking aperture BA under any deflected condition.

FIG. 2 shows additional details required to provide correct illumination of reticle subfields and consequently proper operation of the entire EBPS 10. Magnetic deflectors ALi are required to maintain beam alignment with respect to the apertures, i.e. trim aperture TA, shaping aperture SA, blanking aperture BA. A set of magnetic quadrupoles called stigmator STO is used to ensure symmetric (square) beam shape at shaping aperture SA. Sets of plates DU provide electric deflection of the beam. The magnetic deflectors ALi, stigmator STO, and electric deflection plates DU are the devices, the arrangement and operation of which are at the core of the present invention.

Electric deflection, though less efficient than magnetic deflection, is used for the high speed or high frequency response required for precise exposure dose control at the target of EBPS 10. This is accomplished by deflecting the beam off the aperture openings, such that all radiation is blocked by the diaphragms of apertures blanking aperture BA, shaping aperture SA and trim aperture TA, respectively, for predetermined time periods. Finally, magnetic deflectors DYU and DYL (upper deflection yokes DYU and lower deflection yokes DYL) are provided for positioning the beam over an off-axis subfield in the reticle RET selected at the time. Their relative strengths and deflection directions are adjusted to guarantee a pivot point of the bean fixed at the center of blanking aperture BA, as well as, perpendicular landing at the reticle RET. The combination of illuminator lens doublet IL1 and IL2, deflectors DYU and DYL, and additional corrector elements not shown here, constitute an optical system referred to as a Curvilinear Variable Axis Lens (CVAL). The CVAL provides the best optical performance or minimum image blurring and distortion at largest off-axis positions and shortest distance between object and image, namely shaping aperture and reticle RET.

For an Electron Beam Projection System (EBPS) in accordance with this invention, a tandem blanking system is provided as described copending U.S. patent application, (Docket Number NI998-144), Ser. No. 09/138,592 filed concurrently herewith of Stickel and Golladay for "Blanking System for Electron-Beam Projection System" consisting of three (possibly four) sets of electric blanking deflectors BL1, BL2, BL3, supported, if in practice required, by magnetic deflectors at corresponding axial locations, as well as not one, but two apertures.

The first two deflectors BL1 and BL2 are operated in tandem to place the (virtual) pivot point into the object plane of shaping aperture SA.

The first set of blanking deflector plates BL1 extend from within the lens CN1 almost to the trim aperture TA. Blanking deflector plates BL2 occupy the space between trim aperture TA and shaping aperture SA. The third set of blanking deflector plates BL3 extends from just beyond shaping aperture SA to a point close to the blanking aperture BA.

The third set of blanking deflector plates BL3, provides the actual blanking. If needed, this third set of blanking plates BL3 may be operated again in tandem with a fourth set of blanking plates between blanking aperture BA and the target which is reticle RET, to prevent any motion of the object image at the reticle RET during blanking.

While each of the individual blanking plate sets BL1, BL2, and BL3, in the present configuration shown in FIG. 1 and FIG. 2 of EBPS taken alone is too insensitive to provide adequate blanking, their combined action is efficient. Since the total beam power is substantially higher in EBPS than in any traditional E-beam system used in lithography, it is important to manage thermal energy dissipation properly. The blanking configuration of FIGS. 1 and 2 achieves that:
a) The first (trim) aperture TA dissipates about 50% of the beam power, which is in the order of at least 40 Watts.
b) The double-deflection of the first two sets of plates BL1/BL2 keeps the beam stationary at the shaping aperture SA, more importantly for the purpose of preventing uneven thermal load on its structure than any beam motion effect at the target RET.

Due to the trimming action of the trim aperture TA (which is the initial blanking aperture) in the first lens doublet CN1/CN2 the beam diameter at the blanking aperture BA (which is the other blanking aperture) in the second lens doublet IL1/IL2 is well defined. Therefore, the blanking aperture BA can be designed slightly larger, avoiding inadvertently intersecting the beam as the result of any undesired beam motion. This is of particular importance in EBPS, because the second lens doublet IL1/IL2 acts in combination with a set of magnetic deflectors (upper deflection yokes DYU and lower deflection yokes DYL), which are needed to scan the beam across the target RET (the reticle) over a large distance off the system axis. A small misadjustment of the magnetic deflectors DYU/DYL could easily cause substantial motion at the blanking aperture BA, therefore inadvertently causing intensity modulation at the target RET, and render the system inoperable.

Furthermore, the beam blanking now requires only little more off-axis deflection than the beam diameter at the (second) shaping aperture SA, allowing for lower deflection voltage and therefore increased speed, since any residual current still passing through the shaping aperture SA due to noise jitter on the beam is negligible thanks to the attenuation of the beam by simultaneous deflection over the trim aperture.

In turn the deflection at the trim aperture TA can be minimized for equivalent benefit, since only substantial attenuation, not complete blanking is required there. This combined blanking with electric deflectors BL1, BL2 and BL3 may be adequate for most operating conditions, but for prolonged times of blanking required e.g. during wafer exchange, additional magnetic deflection, slow but strong, may be used for assistance. In all cases, proper timing of the activated deflectors both electric deflectors BL1, BL2 and BL3 and/or magnetic deflectors is essential for best results.

DESCRIPTION OF THE PREFERRED EMBODIMENT

FIG. 3 shows a cross sectional view of an illumination deflection system IDS for E-beam projection in accordance with this invention.

The shaping aperture is located to the left, the blanking aperture BA is shown in the center of FIG. 3 and the reticle RET is indicated to be to the right of FIG. 3. The beam is directed along the axis ZA. Aperture BA is a deflector beam crossover point.

The first step of this invention is the replacement of the presently used illumination deflection configuration with a smaller two-lens combination.

The presently used illumination deflection configuration is essentially identical to the collimator lenslet stack described in U.S. Pat. No. 5,635,719 of Petric, referred to above, including the same number and type of deflectors, with two additional deflectors upstream of this illuminator lenslet/deflector stack for the purpose of pre-deflecting the beam in such a way that the illuminator system then steers the beam onto a path mirroring the path it then follows after passing the reticle, The purpose of such a complex and and space-consuming arrangement is to impose on the reticle illuminating beam the same quality in terms of minimum blurring and distortion as needed for the projection of the selected off-axis reticle subfield onto the target, the wafer.

The two-lens combination of this invention is an improved configuration. It simplifies the lens system, uses a reduced number of deflectors, widens the design space for those deflectors. At the same time it still maintains the quality (blur and distortion) required for the image of the shaping aperture SA, which illuminates the subfield of the reticle at the position selected by the deflectors incorporated into this configuration, which approximates an ideal doublet. It a. permits a (for other reasons preferable) 1:1 imaging of a preceding beam-shaping (square) aperture onto the reticle
b. provides space despite overall length reduction for enough magnetic deflectors as required to move the beam from its on-axis position at the shaping aperture to any off-axis position at the reticle
c. provides the opportunity to place an aperture stop close to or at the center of the doublet to serve as a means to control the timing of the beam impinging on the reticle, commonly known as blanking aperture
d. permits operation of the deflectors such that the beam passes through the (stationary on-axis) blanking aperture at all times, when needed, regardless of its final position at the reticle, without causing excessive aberrations like blurring and distortion.

It has been found by computer simulation that the length of the illuminator-deflector section as well as the number of deflectors can be reduced by more than 40% from the presently implemented configuration, without significantly compromising performance and with the added bonus of accommodating a more efficient beam blanking system, which is crucial for for accurate and fast exposure control.

Referring to FIG. 3, a preferred embodiment of the illuminator lens doublet IL1 & IL2 is shown with a lens L1 of IL1 on the left and a lens L2 of IL2 on the right. The lenses L1 and L2 are toroidal structures shown in cross section formed of magnetic material. The lenses are housed by horseshoe cross section or hollow toroidal shrouds MC1 and MC2 open towards the axis ZA where the E-beam is directed. Portions of shrouds MC1 and MC2 facing the beam denoted as pole piece rings B1, B6 and B7, B12 respectively are composed of ferrite material (which prevents eddy currents) located on the front serving as pole pieces for the lenses L1 and L2 respectively. These pole piece portions face the axis ZA. The bulk of the shrouds MC1 and MC2 [are preferably] may be composed of soft magnetic steel in the back, i.e. away from the axis ZA.

Between the ferrite rings B1 and B6 as well as B7 and B12, serving as pole pieces of the lenses IL1 and IL2, respectively, a plurality of similar rings indicated in FIG. 3 as B2 . . . B5 and B8 . . . B11 are required to shield the field generated by the coils L1 and L2, respectively, from directly affecting the beam. The number of these shielding rings may vary, but all of them must be constructed of magnetic, but non-conductive material like ferrite to prevent the variable magnetic field of the deflectors Di (where i is a positive integer from 1 to 6, i.e. i=1 . . . . 6) from generating eddy currents either in the rings themselves or, if those were not there, in the wire of the coils L1 and L2.

The spacers indicated in FIG. 3 as Rj (where j is a positive integer from 1 to 10, i.e. j=1 . . . 10) are rings similar to the ferrite rings B1 . . . B12, but made of non-magnetic as well as nonconductive material, preferably with similar mechanical properties as the ferrite rings. The purpose of the spacers R1 . . . R10 is to provide the mechanical support for the ferrite rings B1 . . . B12 and spacing between them. Spaces between the ferrite rings B1 . . . B12 are required to prevent the short-circuiting of the magnetic field of the lenses IL1 and IL2, generated essentially between the pole piece rings B1 and B6, and B7 and B12, respectively.

As outlined above, the lens doublet IL1 and IL2 operates in conjunction with deflectors D1–D6 and also correctors F1 . . . F3, S1 . . . S2, and H1 to provide off-axis ZA positioning and selection of any specific reticle subfield maintaining integrity or trueness/fidelity of the image of the shaping aperture SA at the Reticle RET. The number, size and axial location of the deflectors and correctors is not constraint by anything other than the space available between SA and RET, and IL1 and IL2. Simulations have shown, however that a minimum of five deflectors, two stigmators, and two focus coils are required to provide a deflected beam trajectory with the specified optical properties, i.e. minimum image blur and distortion at the farthest point off the central axis ZA.

Figure 4:
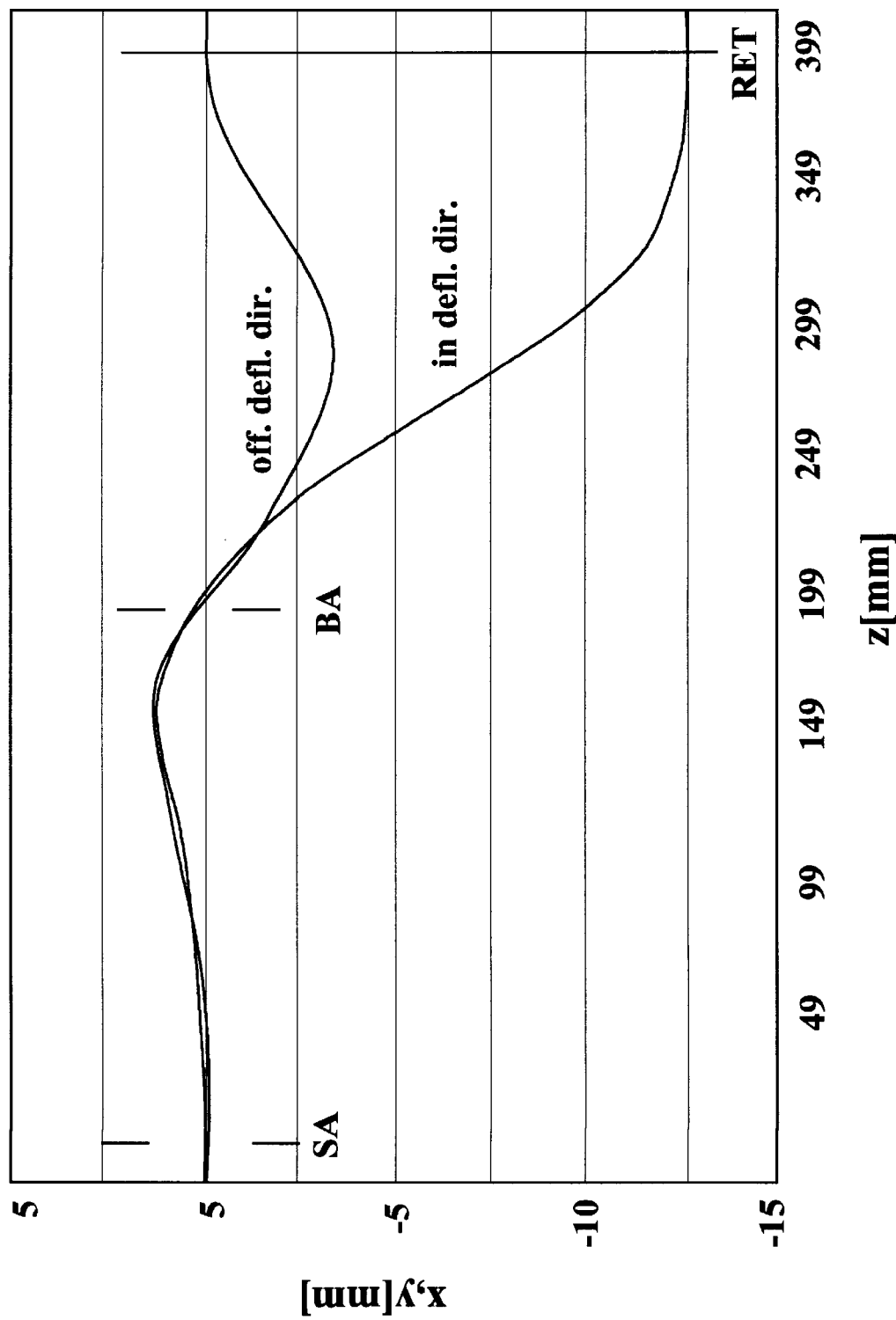
FIG. 4 shows the x and y components of the deflected beam trajectory in the illuminator section along the z axis of the column.

This trajectory would have to be similar, though not exactly like the one shown as an example in FIG. 4. A corrector H1, shown in FIG. 3 at a location not occupied by any other corrector, may or may not be required to minimize four-fold deflection aberrations generated by either less than optimally designed and/or fabricated deflectors or change of their symmetry, e.g. by thermal expansion. Furthermore, the exact location of corrector Hi can, within limits, be arbitrarily chosen by the designer, as is applicable to the other correctors F1–F3, S1 . . . S2. It must be noted that none of the deflectors and correctors can contain any magnetic material, as this would adversely affect the lens fields of lenses IL1 and IL2, as well as prevent the speedy change of excitation of these elements during addressing the reticle subfield to be illuminated by the beam at any point in time.

FIG. 3 shows as a preferred possible embodiment the positioning of the correctors within the radius of the deflectors. The optical performance of this arrangement would not significantly change for the reversed configuration. It is a matter of design, essentially the balance of the excitation currents required for the deflectors and the correctors, affecting the overall speed, with which any reticle subfield can be addressed.

The space C1 indicated in FIG. 3 is essentially arbitrary, but may be convenient to provide easy access for evacuation, electrical contact and/or cooling to the assembly containing the blanking aperture BA.

In the preferred embodiment, correctors comprising three focus coils F1, F2 and F3 are provided inside or outside of the diameter of the deflectors D1–D6 along with two stigmators S1 and S2 and possibly a hexapole Hi which corrects for "four fold aberration". Each of the stigmators is formed of two quadrupoles.

The correctors comprising focus coils F1, F2, F3, stigmators S1, S2 and hexapole H1 are all concentric with the axis ZA and within or outside the diameter of the deflectors D1–D6. As shown the hexapole H1 is to the left end of lens L1, focus coil F1 is in the center and stigmator S1 is to the right of lens L1. Focus coil F1 is to the left end of lens L2, stigmator S2 is in the center and focus coil F3 is to the right of lens L2. The portions of the housings away from axis ZA are housings HSi preferably composed of magnetic steel. The portions of the housings HS2 nearer to the axis ZA are composed a material such as plastic or ceramic which is nonmagnetic and non-conductive for the same reason as spacers Ri.

In summary, while one could have as many as nine deflectors and a minimum of three deflectors, five or more is practical.

FIG. 4 shows the illuminator doublet deflected trajectories in the in the x and y directions along the z axis of the column.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A charged particle beam projection system comprising:
    a source of charged particles,
    a first doublet of condenser lenses,
    a first aperture located between said condenser lenses of said first doublet,
    a second aperture comprising a shaping aperture,
    a second doublet of condenser lenses with a second symmetry plane,
    a symmetry plane aperture located at the symmetry plane of said second doublet wherein said symmetry plane aperture comprises a blanking aperture,
    said second doublet comprising a pair of illuminator lenses.

2. A charged particle beam projection system in accordance with claim 1 comprising:
    said first doublet of condenser lenses including a first symmetry plane, and
    said first aperture comprising a trim aperture located at said first symmetry plane of said first doublet wherein said trim aperture also serves as a blanking aperture.

3. A charged particle beam projection system in accordance with claim 2 including:
    first blanking plates between said first condenser lens and said trim aperture,
    second electrostatic alignment plates between said trim aperture and said second aperture.

4. A charged particle beam projection system in accordance with claim 3 including:
    first blanking plates between said first condenser lens and said trim aperture,
    second electrostatic alignment plates between said trim aperture and said second aperture, and
    a third aperture located at the symmetry plane of said second doublet wherein said third aperture comprises another blanking aperture, and
    third electrostatic alignment plates between said second aperture and said third aperture.

5. A charged particle beam projection system in accordance with claim 2 wherein said second doublet comprising said pair of illuminator lenses includes deflectors coaxial therewith and located inside the radius of said lenses.

6. A charged particle beam projection system in accordance with claim 2 wherein:
    said second doublet comprising said pair of illuminator lenses includes deflectors coaxial therewith and located inside the radius of said lenses and
    shielding rings located along the inner surfaces of said lenses.

7. A charged particle beam projection system in accordance with claim 2 wherein:
    said second doublet comprising said pair of illuminator lenses includes deflectors coaxial therewith and located inside the radius of said lenses and
    shielding rings located along the inner surfaces of said lenses, and
    correctors located coaxial with said deflectors.

8. A charged particle beam projection system in accordance with claim 2 wherein:
    said second doublet comprising said pair of illuminator lenses includes deflectors coaxial therewith and located inside the radius of said lenses and
    shielding rings located along the inner surfaces of said lenses, and
    correctors located coaxial with said deflectors including stigmators and focus coils.

9. A charged particle beam projection system in accordance with claim 2 wherein:
    said second doublet comprising said pair of illuminator lenses includes deflectors coaxial therewith and located inside the radius of said lenses and
    shielding rings located along the inner surfaces of said lenses, and
    correctors located coaxial with said deflectors including stigmators, focus coils and a hexapole.

10. An electron beam projection system comprising:
    a source of an electron beam,
    a first doublet of condenser lenses with a first symmetry plane,
    a first aperture comprising a trim aperture located at said first symmetry plane of said first doublet also serving as a first blanking aperture,
    a second aperture comprising a shaping aperture located below said trim aperture, a second doublet of condenser lenses with a second symmetry plane is located below said second aperture, said second doublet having a symmetry plane, a third aperture located at the symmetry plane of said second doublet wherein said third aperture comprises another blanking aperture, first blanking plates between said first condenser lens and said trim aperture, and second electrostatic alignment plates between said trim aperture and said second aperture, and said second doublet comprising a pair of illuminator lenses.

11. An electron beam projection system in accordance with claim 10 including:

first blanking plates between said first condenser lens and said trim aperture, second electrostatic alignment plates between said trim aperture and said second aperture.

12. An electron beam projection system in accordance with claim 10 including:

first blanking plates between said first condenser lens and said trim aperture, second electrostatic alignment plates between said trim aperture and said second aperture, and a third aperture located at the symmetry plane of said second doublet wherein said third aperture comprises another blanking aperture, and third electrostatic alignment plates between said second aperture and said third aperture.

13. An electron beam projection system in accordance with claim 10 wherein said second doublet comprising said pair of illuminator lenses includes deflectors coaxial therewith and located inside the radius of said lenses.

14. An electron beam projection system in accordance with claim 10 wherein:

said second doublet comprising said pair of illuminator lenses includes deflectors coaxial therewith and located inside the radius of said lenses and shielding rings located along the inner surfaces of said lenses.

15. An electron beam projection system in accordance with claim 10 wherein:

said second doublet comprising said pair of illuminator lenses includes deflectors coaxial therewith and located inside the radius of said lenses and shielding rings located along the inner surfaces of said lenses, and correctors located coaxial with said deflectors.

16. An electron beam projection system in accordance with claim 10 wherein:

said second doublet comprising said pair of illuminator lenses includes deflectors coaxial therewith and located inside the radius of said lenses and shielding rings located along the inner surfaces of said lenses, and correctors located coaxial with said deflectors including stigmators and focus coils.

17. An electron beam projection system in accordance with claim 10 wherein:

said second doublet comprising said pair of illuminator lenses includes deflectors coaxial therewith and located inside the radius of said lenses and shielding rings located along the inner surfaces of said lenses, and correctors located coaxial with said deflectors including stigmators, focus coils and a hexapole.

* * * * *